(12) United States Patent
Ahn et al.

(10) Patent No.: US 9,958,770 B2
(45) Date of Patent: May 1, 2018

(54) PELLICLE FOR EUV LITHOGRAPHY

(71) Applicant: INDUSTRY-UNIVERSITY COOPERATION FOUNDATION HANYANG UNIVERSITY, Seoul (KR)

(72) Inventors: Jinho Ahn, Seoul (KR); Jaeuk Lee, Yangsan-si (KR); Seongchul Hong, Seoul (KR); Seungmin Lee, Busan (KR); Kilbock Lee, Seoul (KR); Jungsik Kim, Seongnam-si (KR); Junghwan Kim, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 68 days.

(21) Appl. No.: 15/304,275

(22) PCT Filed: Apr. 15, 2015

(86) PCT No.: PCT/KR2015/003783
§ 371 (c)(1),
(2) Date: Oct. 14, 2016

(87) PCT Pub. No.: WO2015/160185
PCT Pub. Date: Oct. 22, 2015

(65) Prior Publication Data
US 2017/0038675 A1    Feb. 9, 2017

(30) Foreign Application Priority Data

Apr. 17, 2014 (KR) .................. 10-2014-0046210
Apr. 17, 2014 (KR) .................. 10-2014-0046218

(51) Int. Cl.
*G03F 1/62* (2012.01)
*H01L 21/027* (2006.01)
*G03F 7/20* (2006.01)

(52) U.S. Cl.
CPC .............. *G03F 1/62* (2013.01); *G03F 7/2004* (2013.01); *H01L 21/027* (2013.01)

(58) Field of Classification Search
CPC ................................. G03F 1/62; G03F 7/2004
USPC ............................................................. 430/5
See application file for complete search history.

(56) References Cited

U.S. PATENT DOCUMENTS

| 9,547,232 B2* | 1/2017 | Levinson .................. G03F 1/22 |
| 2002/0052100 A1 | 5/2002 | Tanaka et al. |
| 2009/0291372 A1 | 11/2009 | Kubota et al. |

FOREIGN PATENT DOCUMENTS

| JP | 1989-173041 A | 7/1989 |
| JP | 2002-131883 A | 5/2002 |
| JP | 2009-282298 A | 12/2009 |
| JP | 2013-165102 A | 8/2013 |
| KR | 1020090032876 A | 4/2009 |

* cited by examiner

*Primary Examiner* — Christopher G Young
(74) *Attorney, Agent, or Firm* — Ladas & Parry LLP (57) ABSTRACT

A pellicle for EUV lithography is provided. The pellicle for EUV lithography may improve strength of a pellicle film by having a strength reinforcing layer including a first coupling layer and a carbon nanostructure disposed on a first inorganic layer, the first coupling layer here increase coupling strength between the first inorganic layer and the strength reinforcing layer, and a strength reinforcing layer including a carbon nanostructure. Also, a pellicle for EUV lithography according to another embodiment and a method of fabricating the same are provided. The pellicle for EUV lithography includes a plurality of holes and is a porous thin film made of a material with an extinction coefficient less than or equal to 0.02, and a diameter of the holes is less than or equal to 1 μm. Accordingly, improved strength is achievable because thickness may be made large with still having high EUV transmission.

18 Claims, 7 Drawing Sheets

PELLICLE FOR EUV LITHOGRAPHY

TECHNICAL FIELD

The present invention relates to a pellicle for EUV lithography and, more particularly, a pellicle for EUV lithography with improved strength without a separate support structure and a pellicle for EUV lithography with increased EUV transmission and strength.

BACKGROUND ART

Extreme ultraviolet (EUV) lithography technology is a pattern forming technology using a 13.5 nm wavelength light source, which is very short compared to the conventional photolithography technology using 193 nm light from an ArF light source.

This is considered a core technology for fabricating semiconductor devices having a line width of pattern with 22 nm or less.

The EUV light source is strongly absorbed by all materials naturally in existence, and, therefore, design of necessary equipment for processing in terms of form, structure etc. changes from the conventional photolithography.

Because EUV is so highly absorbed, for photolithography equipment, transmission optics are not used, and all optics in EUV optics are of the reflective type.

An EUV pellicle for lithography is for protecting a mask, is mounted on a mask, and is fabricated as a transmissive thin film.

While a pellicle made of a single thin film layer of silicon, that is, a pellicle for EUV lithography for which research has advanced the most may achieve adequate EUV transmission because a thin film is formed of mechanically weak silicon that is 100 nm or less, due to the low strength, fragility is a problem in which the pellicle is easily torn due to even a small impact, etc.

Accordingly, while a pellicle with an attached support structure in a honeycomb structure, etc. are being researched to improve the strength of a single silicon thin film, in this case, while it is possible to partially improve the problems of sagging, tearing, etc., a new problem occurs in which there is a non-uniformity of intensity of EUV light, etc. due to the shape and thickness of the support structure.

Further, there has been a problem in which it is extremely difficult to make an adequately microscopic support structure that can solve the problem of intensity EUV light becoming non-uniform.

Accordingly, there is a need for research on a pellicle for EUV lithography without a separate support structure and with improved strength and EUV transmission.

On the other hand, when unwanted particles become attached on a lithography mask surface during an EUV exposure, defects due to the particles are formed during pattern formation using lithography.

To prevent the particles from being attached on the surface, a pellicle is fabricated in a form that protects a mask pattern. However, because wavelength of EUV light is well absorbed by all materials, the pellicle absorbs the light, round-trip optical paths are formed because the protected mask is in a reflective form, and thus absorption occurs twice per pellicle layer. Accordingly, such a pellicle causes loss of light.

This can greatly reduce throughput of a semiconductor EUV lithography exposure tool.

Accordingly, a pellicle for EUV lithography is formed as a transmissive thin film and mounted on a mask to protect the mask.

A pellicle for EUV lithography for which research has advanced the most is one made of a single thin film layer of silicon. Because such a pellicle made of a single thin film layer of silicon is just a single thin film layer of mechanically weak silicon that is 100 nm or less, adequate transmission of EUV is achieved, however fragility is a problem due to the low strength, where the pellicle is easily torn due to even a small impact, etc.

Accordingly, while a pellicle with an attached support structure in a honeycomb structure, etc. is being researched to improve the strength of a single silicon thin film, in this case, while it is possible to partially improve problems of sagging, tearing, etc., a new problem occurs in which there is a non-uniformity of intensity of EUV light, etc. due to the shape and thickness of the support structure.

Further, there has been a problem in which it is extremely difficult to make an adequately microscopic support structure that can solve the problem of intensity of EUV light becoming non-uniform.

Accordingly, there is a need for research on a pellicle for EUV lithography capable of fulfilling requirements of both EUV transmission and strength.

DISCLOSURE OF INVENTION

Technical Problem

The present invention is directed to providing a pellicle for EUV lithography with improved strength, without a separate support structure.

Also, the present invention is directed to providing a pellicle for EUV lithography with improved EUV transmission and strength, and a method of making the same.

Technical Solution

An aspect of the present invention provides a pellicle for EUV lithography. The pellicle for EUV lithography may include a first inorganic layer including an inorganic material with an extinction coefficient less than or equal to 0.02, a first coupling layer disposed on the first inorganic layer and including an organic material having a functional group belonging to the catechol group, and a strength reinforcing layer disposed on the first coupling layer and including a carbon nanostructure. Here, the first coupling layer increases coupling strength between the first inorganic layer and the strength reinforcing layer.

Also, the first inorganic layer may include Zr, Mo, Y, Si, Rb, Sr, Nb, or Ru.

Also, the first coupling layer may include dopamine, polydopamine, norepinephrine, polynorepinephrine, epinephrine, or polyepinephrine.

Also, a thickness of the first coupling layer may be less than or equal to 10 nm.

Also, the carbon nanostructure may include graphene or carbon nanotubes.

Also, the strength reinforcing layer may be a carbon nanotube mesh.

Also, a second coupling layer disposed on the strength reinforcing layer and including an organic material having a functional group belonging to the catechol group and a second inorganic layer disposed on the second coupling layer and including an inorganic material with an extinction coefficient less than or equal to 0.02 may further be included.

Also, the second coupling layer may increase coupling strength between the strength reinforcing layer and the second inorganic layer.

Here, the second coupling layer may include dopamine, polydopamine, norepinephrine, polynorepinephrine, epinephrine, or polyepinephrine.

Also here, the second inorganic layer may include Zr, Mo, Y, Si, Rb, Sr, Nb, or Ru.

Another aspect of the present invention provides a pellicle for EUV lithography. The pellicle for EUV lithography is a porous thin film pellicle including a plurality of holes and a material with an extinction coefficient less than or equal to 0.02, and a diameter of the holes is less than or equal to 1 μm.

Also, the porous thin film pellicle may include Zr, Mo, Y, Si, Rb, Sr, Nb, or Ru.

Meanwhile, a cap layer disposed on the porous thin film pellicle and made of a material with an extinction coefficient less than or equal to 0.02 may further be included.

Another aspect of the present invention provides a method of fabricating a pellicle for EUV lithography. The method may include preparing a porous structure with nano-sized holes, forming a template with a shape that is complementary to the shape of the porous structure by injecting a template material into holes of the porous structure, removing the porous structure, forming a porous thin film pellicle including the shape of the porous structure by coating the template with a pellicle material, and removing the template.

Also, the porous structure may include anodized aluminum.

Also, the template material may include PDMS or PMMA.

Also, injecting a template material into holes of the porous structure may include increasing filling rate of the holes of the porous structure being filled with the template material by maintaining a vacuum for a specific duration after injecting the template material.

Also, the pellicle material may include Zr, Mo, Y, Si, Rb, Sr, Nb, or Ru.

Advantageous Effects

According to the present invention, strength of a pellicle film may be increased by having a strength reinforcing layer including a carbon nanostructure.

Also, by inserting a coupling layer including an organic material between an inorganic layer and a strength reinforcing layer, coupling strength between the inorganic layer and the strength reinforcing layer may be increased, and, further, brittleness of the inorganic layer can be alleviated using ductility of the organic material.

Also, because a separate support structure is not needed for reinforcing strength, there is no drawback of non-uniform EUV intensity due to the added support structure, after transmission through a pellicle.

Also, according to another embodiment of the present invention, by using a porous thin film with a plurality of holes as the pellicle itself, increased strength may be achieved because thickness may be increased with still having EUV transmission that is higher compared to a single thin film pellicle without holes.

Also, a method of fabricating a pellicle for EUV lithography according to the present invention uses reproduction of a porous structure, and, by modifying a material deposited on a template for a pellicle, pellicle fabrication with a variety of materials is possible. Also, with such a pellicle material, selecting a material is possible for the purpose of adjusting strength and light transmission of a pellicle.

Also, for such a pellicle, diameter of holes or film thickness is adjustable via a porous structure growth method, for example, an AAO growth method, and pellicle fabrication is possible with various materials and hole sizes. Accordingly, mechanical strength and light transmission can easily be adjusted.

Also, because porous thin film pellicles can simply be repeatedly reproduced as long as there is a porous structure, for example, an AAO structure, a support layer fabrication method involving an inconvenient conventional patterning technique and etching technique can be substituted.

The technical effects and advantages of the present invention are not limited by the aforementioned, and other, yet unmentioned technical effects and advantages are clearly understandable by a person of ordinary skill in the art from the description hereinafter.

MODE OF INVENTION

Exemplary embodiments of the present invention are described in detail as follows, with reference to accompanying drawings.

While the present invention allows various modifications and transformations, specific embodiments are exemplified by the drawings and will be explained below in detail. However, there is no intent to limit the present invention to the specific form disclosed herein, and the present invention instead includes all modifications, equivalents, and alternatives included in the concepts and technical scope defined by the claims.

When it is mentioned that an element, such as a layer, an area, or a substrate exists "on" another element, it is to be understood that the element may exist directly on the other element or an intervening element may also exist therebetween.

Although words including "first", "second", etc. may be used to describe various elements, substances, areas, layers, and/or locations, these words are understood not to limit the elements, substances, areas, layers, and/or locations.

Meanwhile, "for EUV lithography" means used in a lithography process that uses a light source with the EUV wavelength (λ=13.5 nm) or a wavelength shorter than the EUV wavelength.

Figure 1:
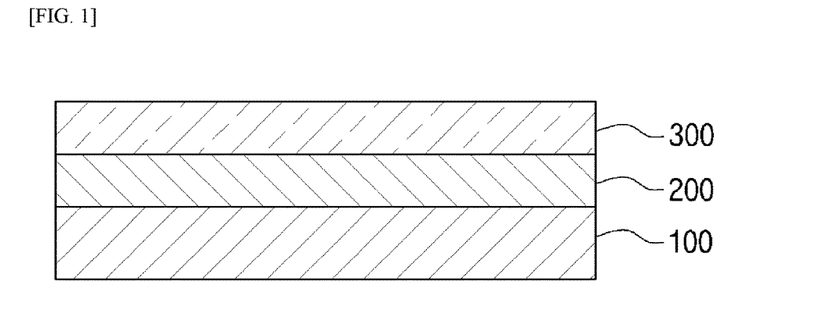
FIG. 1 is a cross-sectional view of a pellicle for EUV lithography according to an embodiment of the present invention.

FIG. 1 is a cross-sectional view of a pellicle for EUV lithography according to an embodiment of the present invention.

Referring to FIG. 1, a pellicle for EUV lithography according to an embodiment of the present invention may include a first inorganic layer 100, a first coupling layer 200, and a strength reinforcing layer 300.

The first inorganic layer 100 may include an inorganic material with an extinction coefficient less than or equal to 0.02.

For example, a pellicle for an EUV lithography mask is basically a protective layer for preventing introduction of contaminants. Further, for use as a protective layer for an EUV lithography mask, it is preferable to select a material with high EUV transmission.

EUV transmission is related to the extinction coefficient of the optical constant.

$$n=1-\delta+i\beta \qquad \text{Equation 1}$$

In the complex refractive index equation expressed by Equation 1 for EUV/soft x-ray ranges, the real part of the refractive index (n), δ is known as the refraction coefficient or refraction index, and the complex part β is known as the extinction coefficient.

Accordingly, a preferred candidate material for a pellicle for EUV lithography is a material with low EUV absorption due to a small extinction coefficient.

Accordingly, the first inorganic layer 100 is a material with high EUV transmission and, thus, preferably includes an inorganic material with an extinction coefficient less than or equal to 0.02.

For example, a material with an extinction coefficient less than or equal to 0.02 may include Zr, Mo, Y, Si, Rb, Sr, Nb, or Ru. For example, the extinction coefficient of silicon (Si) is 0.001826 and, thus, is a material with low EUV absorption and suitable as a constituent material of the first inorganic layer 100.

Meanwhile, even if an extinction coefficient of such an inorganic material is small, because EUV transmission decreases with increasing thickness of a first organic layer 100, fulfilling a requirement of EUV transmission at or above a specific value while increasing thickness to increase strength is limited using a single inorganic film layer. Accordingly, the present invention improves strength of a pellicle using a strength reinforcing layer described below.

The first coupling layer 200 is on the first inorganic layer 100. The first coupling layer 200 fulfills a role of increasing coupling strength between the first inorganic layer 100 and the strength reinforcing layer 300 described below.

Accordingly, the first coupling layer 200 may include an organic material with a functional group belonging to the catechol group. For example, such an organic material with a functional group belonging to the catechol group may include dopamine, polydopamine, norepinephrine, polynorepinephrine, epinephrine, or polyepinephrine.

A catechol is referred to a molecular structure having an alkyl hydroxyl functional group (—OH) attached at number 3 and 4 positions of a benzene ring. A material with a catechol enables to form a coupling with other materials.

The catechol facilitates coupling between materials, regardless of the type of substrates, by increasing coupling strength. A structure of which a material including a catechol helps reinforcement of coupling has a molecular structure at which catechol rings are attached on both branches.

Figure 2:
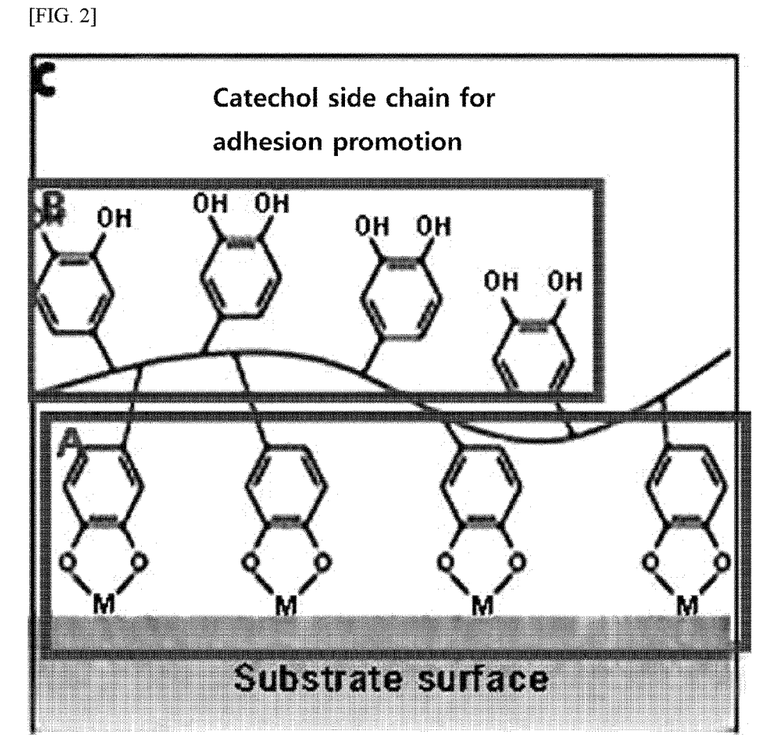
FIG. 2 is a mimetic diagram showing a molecular structure during forming a coupling of an embodiment of a coupling.

FIG. 2 is a mimetic diagram showing a molecular structure during forming a coupling of an embodiment of a coupling.

Referring to FIG. 2, an alkyl hydroxyl functional group (—OH) of a catechol in portion A forms a coupling with a substrate surface, and an alkyl hydroxyl functional group of a catechol in portion B on opposite branch forms a coupling with other external materials.

The catechol in portion B is called an anchoring, for which the alkyl hydroxyl functional group and substrate surface react to adhere and form a basis for other materials to come and be attached. Accordingly, portion B may form a coupling with other external materials via the alkyl hydroxyl functional groups of the catechol.

Again referring to FIG. 1, because the first coupling layer 200 includes an organic material, brittleness of the inorganic material may be alleviated using flexibility thereof.

A thickness of the first coupling layer 200 may be less than or equal to 10 nm. When the thickness of the first coupling layer 200 exceeds 10 nm, because EUV transmission through the first coupling layer is decreased, a EUV transmission requirement possibly may not be fulfilled.

The first coupling layer 200 may be formed on the inorganic layer 100 using a liquid coating method. For example, a first coupling layer 200 with a thickness of 1 nm can be formed by immersing a sample with an exposed silicon thin film in a beaker with epinephrine aqueous solution for about 3 hours.

The strength reinforcing layer 300 is disposed on the first coupling layer 200. Such a strength reinforcing layer 300 may include a carbon nanostructure. With the extinction coefficient for carbon being 0.006905, EUV transmission is high, and strength of a pellicle may be increased because mechanical strength of the carbon nanostructure is high compared to the aforementioned inorganic layer.

Such a carbon nanostructure may include graphene or carbon nanotubes.

Preferably, the reinforcing layer 300 may be a carbon nanotube mesh.

In the case of adding a conventional support layer pattern, because space between neighboring pattern elements is tens of microns, a problem of non-uniform EUV light intensity occurred after transmission through a pellicle. However, in the case of a carbon nanotube mesh of the present invention, because open portions between carbon nanotubes are nano-sized, a problem of non-uniform EUV light intensity does not occur even after transmission through a pellicle.

Further, in the case of the carbon nanotube mesh, because open portions exist between carbon nanotubes, EUV transmission is higher compared to a thin film form of a graphene layer or a carbon nanotube layer.

Such a strength reinforcing layer 300 may be adhered to the first coupling layer 200 by a carbon nanotube deposition method using spin coating, a graphene transfer method using PMMA or PDMS, a graphene transfer method using a thermal conductive tape, or a graphene transfer method using a roll. For example, after forming a carbon nanotube mesh using spin coating, the carbon nanotube mesh may be adhered to the first coupling layer 200.

According to the present invention, in the case of a combination layer of inorganic material, organic material, and carbon nanotubes, because strength is higher compared to a conventional single film, fabrication with a thickness reduced compared to a single film is possible, and using such a method, EUV transmission may be improved compared to a conventional thin film pellicle.

Figure 3:
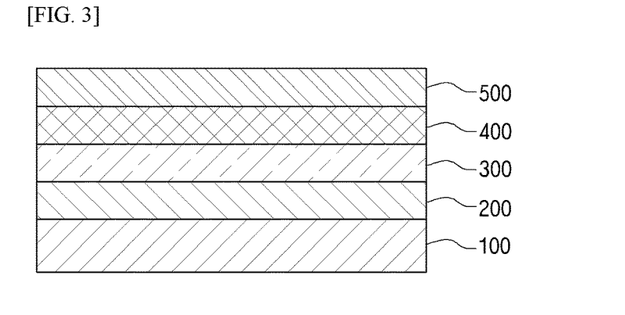
FIG. 3 is a cross-sectional view of a pellicle for EUV lithography according to another embodiment of the present invention.

FIG. 3 is a cross-sectional view of a pellicle for EUV lithography according to another embodiment of the present invention.

Referring to FIG. 3, a pellicle for EUV lithography according to another embodiment of the present invention may include a first inorganic layer 100, a first coupling layer 200, a strength reinforcing layer 300, a second coupling layer 400, and a second inorganic layer 500.

The first inorganic layer 100 may include an inorganic material with an extinction coefficient less than or equal to 0.02.

This is because a material with high EUV transmission should preferably be selected for use with a mask for EUV lithography, and thus, as a material for a first inorganic layer 100, an inorganic material with an extinction coefficient less than or equal to 0.02 is appropriate.

For example, a material with an extinction coefficient less than or equal to 0.02 may include Zr, Mo, Y, Si, Rb, Sr, Nb, or Ru. For example, the extinction coefficient of silicon (Si) is 0.01826 and, thus, is a material with low EUV absorption and suitable as a constituent material of the first inorganic layer 100.

The first coupling layer 200 is on the first inorganic layer 100. The first coupling layer 200 fulfills a role of increasing coupling strength between the first inorganic layer 100 and the strength reinforcing layer 300 described below.

Accordingly, the first coupling layer 200 may include an organic material with a functional group belonging to the catechol group. For example, an organic material with a functional group belonging to the catechol group may include dopamine, polydopamine, norepinephrine, polynorepinephrine, epinephrine, or polyepinephrine.

A thickness of the first coupling layer 200 may be less than or equal to 10 nm. When the thickness of the first coupling layer 200 exceeds 10 nm, because EUV transmission through the first coupling layer 200 is decreased, a EUV transmission requirement possibly may not be fulfilled.

The first coupling layer 200 may be formed on the inorganic layer 100 using a liquid coating method. For example, a first coupling layer 200 with a thickness of 1 nm can be formed by immersing a sample with an exposed silicon thin film in a beaker with epinephrine for about 3 hours.

The strength reinforcing layer 300 is disposed on the first coupling layer 200. Such a strength reinforcing layer 300 may include a carbon nanostructure.

Such a carbon nanostructure may include graphene or carbon nanotubes.

Preferably, the reinforcing layer 300 may be a carbon nanotube mesh. In the case of the carbon nanotube mesh, because open portions exist between carbon nanotubes, EUV transmission is higher compared to a thin film form of a graphene layer or a carbon nanotube layer.

Such a strength reinforcing layer 300 may be adhered to the first coupling layer 200 by a carbon nanotube deposition method using spin coating, a graphene transfer method using PMMA or PDMS, a graphene transfer method using a thermal conductive tape, or a graphene transfer method using a roll. For example, after forming a carbon nanotube mesh using spin coating, the carbon nanotube mesh may be adhered to the first coupling layer 200.

The second coupling layer 400 is on the strength reinforcing layer 300. The second coupling layer 400 fulfills a role of increasing coupling strength between the strength reinforcing layer 300 and the second inorganic layer 500 described below.

Accordingly, the second coupling layer 400 may include an organic material with a functional group belonging to the catechol group. For example, such an organic material with a functional group belonging to the catechol group may include dopamine, polydopamine, norepinephrine, polynorepinephrine, epinephrine, or polyepinephrine.

A thickness of the second coupling layer 400 may be less than or equal to 10 nm. When the thickness of the second coupling layer 400 exceeds 10 nm, because EUV transmission through the second coupling layer 400 is decreased, a EUV transmission requirement possibly may not be fulfilled.

The second coupling layer 400 may be formed on the strength reinforcing layer 300 using a liquid coating method. For example, a second coupling layer 400 with a thickness of 1 nm can be formed by immersing a sample with an exposed carbon nanotube mesh in a beaker with epinephrine for about 3 hours.

The second inorganic layer 500 is disposed on the second coupling layer 400. The second inorganic layer 500 may include a material with an extinction coefficient less than or equal to 0.02.

This is because a material with high EUV transmission should preferably be selected for use with a mask for EUV lithography, and thus, an inorganic material with an extinction coefficient less than or equal to 0.02 is appropriate.

For example, a material with an extinction coefficient less than or equal to 0.02 may include Zr, Mo, Y, Si, Rb, Sr, Nb, or Ru. For example, the extinction coefficient of silicon (Si) is 0.01826 and, thus, is a material with low EUV absorption and suitable as a constituent material of the second inorganic layer 500.

For example, the second inorganic layer 500 may be formed on the second coupling layer 400 using a conventional thin film deposition method such as ALD, CVD, evaporation, or sputtering, etc.

In this case, in a configuration where a strength reinforcing layer 300 is inserted between inorganic layer 100 and inorganic layer 500, inorganic layers are disposed on the pellicle surfaces. Accordingly, whereas contamination due to a carbon material may be a concern when a pellicle surface is a strength reinforcing layer including a carbon nanostructure, when a pellicle surface is an inorganic layer, there is no such problem.

Measurement of EUV Transmittance Through a Silicon Thin Film

A silicon thin film was fabricated as an example of an inorganic layer of a pellicle for EUV lithography, and EUV transmittance was measured.

Having measured EUV transmittance depending on silicon thin film thickness, EUV transmittance measurement results are as shown in table 1.

TABLE 1

| Thickness | Single crystal Si (theoretical value) | a-Si (theoretical value) | a-Si (measured value) |
| --- | --- | --- | --- |
| 5 nm | 99.40% | 98.93% | 98.84% |
| 10 nm | 98.81% | 97.86% | 95.56% |

As shown in Table 1, transmittance measurement results of the silicon thin film were similar to the values resulting from simulations.

Referring to Table 1, EUV transmission was seen to decrease with increasing silicon thin film thickness.

Measurement of EUV Transmittance Through an Epinephrine Thin Film

An epinephrine thin film was fabricated as an example of a coupling layer of a pellicle for EUV lithography, and EUV transmittance was measured.

Having measured EUV transmittance depending on epinephrine thin film thickness, EUV transmittance measurement results are as shown in Table 2.

TABLE 2

| Thickness | Epinephrine (measured value) |
| --- | --- |
| 1 nm | 95.8% |
| 4.4 nm | 92.62% |
| 6 nm | 71.84% |

Referring to table 2, EUV transmission is 95.8% when epinephrine thin film thickness is 1 nm. However, when the thickness of epinephrine was increase to 4.4 nm and 6 nm, EUV transmission was 92.62% and 71.84%, respectively, indicating decreasing EUV transmission.

According to the present invention, strength of a pellicle film may be improved by having a strength reinforcing layer including a carbon nanostructure.

Also, by inserting a coupling layer including an organic material between an inorganic layer and a strength reinforcing layer, coupling strength between the inorganic layer and the strength reinforcing layer can be increased, and, further, brittleness of the inorganic layer can be alleviated using ductility of the organic material.

Also, because a separate support structure is not needed for reinforcing strength, there is no drawback of non-uniform EUV intensity due to an added support structure, after transmission through a pellicle.

Figure 4:
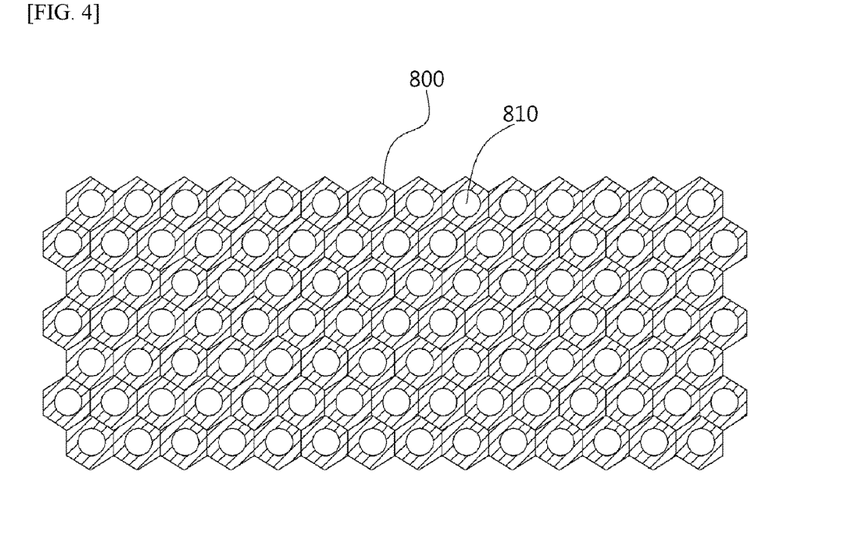
FIG. 4 is a plan view of a pellicle for EUV lithography according to another embodiment of the present invention.

FIG. 4 is a plan view of a pellicle for EUV lithography according to another embodiment of the present invention.

Referring to FIG. 4, a pellicle for EUV lithography according to an embodiment of the present invention is a porous thin film pellicle 800 including a plurality of holes 810 and a material with an extinction coefficient less than or equal to 0.02.

That is, a porous thin film pellicle 800 for EUV lithography preferably includes a material with a high EUV transmission, which is a material with an extinction coefficient less than or equal to 0.02.

For example, a pellicle for a EUV lithography mask is basically a protective layer for preventing introduction of contaminants. Further, for use as a protective layer for a EUV lithography mask, it is preferable to select a material with high EUV transmittance.

EUV transmittance is related to the extinction coefficient of the optical constant.

$$n = 1 - \delta + i\beta \qquad \text{Equation 2}$$

In the complex refractive index equation expressed by Equation 2 for EUV/soft x-ray ranges, the real part of the refractive index (n), $\delta$ is known as the refraction coefficient or refraction index, and the complex part $\beta$ is known as the extinction coefficient.

Accordingly, a preferred candidate material for a pellicle for EUV lithography is a material with low EUV absorption due to a small extinction coefficient.

For example, a material with an extinction coefficient less than or equal to 0.02 may include Zr, Mo, Y, Si, Rb, Sr, Nb, or Ru. For example, the extinction coefficient of silicon (Si) is 0.001826 and, thus, is a material with low EUV absorption and suitable as a constituent material of the pellicle material.

Meanwhile, even if an extinction coefficient of such a pellicle material is small, because EUV transmission decreases with increasing thickness of the pellicle, there is a specific limit to increasing strength by increasing thickness.

Accordingly, the present invention uses a porous thin film including a plurality of holes 810 as the pellicle itself. That is, because EUV light can directly pass through the holes 810 of such a porous thin film pellicle 800, amount absorbed by the porous thin film can be decreased, and EUV transmission requirement can be fulfilled even when thickness is increased a little bit.

Accordingly, because a porous thin film pellicle 800 with a plurality of holes 810 can be made thicker with still having higher EUV transmission compared to a single thin film pellicle without holes, improved strength may be achieved.

Here, a diameter of a hole 810 is less than or equal to 1 μm. When the diameter of a hole 810 exceeds 1 μm, a problem of non-uniform EUV light intensity may occur after transmission through a pellicle.

By setting the diameter of the holes 810 to be nano-sized at or below 1 μm, a problem of non-uniform EUV light intensity can be prevented even after transmission through a pellicle.

Also, a ratio of the diameter of a hole 810 and the pitch of a hole 810 is preferably 5:10 to 9:10.

When the ratio of the diameter of a hole 810 and the pitch of a hole 810 is less than 5:10, that is, when the diameter of a holes 810 is less than ½ of the pitch of the hole 810, because the ratio of the sum area of the holes 810 relative to the total area of the porous thin film pellicle 800 is small, an increase of EUV transmission of a porous thin film pellicle 800 compared to a single thin film without holes is small. Accordingly, there is a limit to improving strength by increasing thickness of a porous thin film.

On the other hand, a cap layer (not shown) disposed on the porous thin film pellicle 800 and made of a material with an extinction coefficient less than or equal to 0.02 may further be included.

For example, such a cap layer (not shown) may include Zr, Mo, Y, Si, Rb, Sr, Nb, or Ru.

Figure 5:
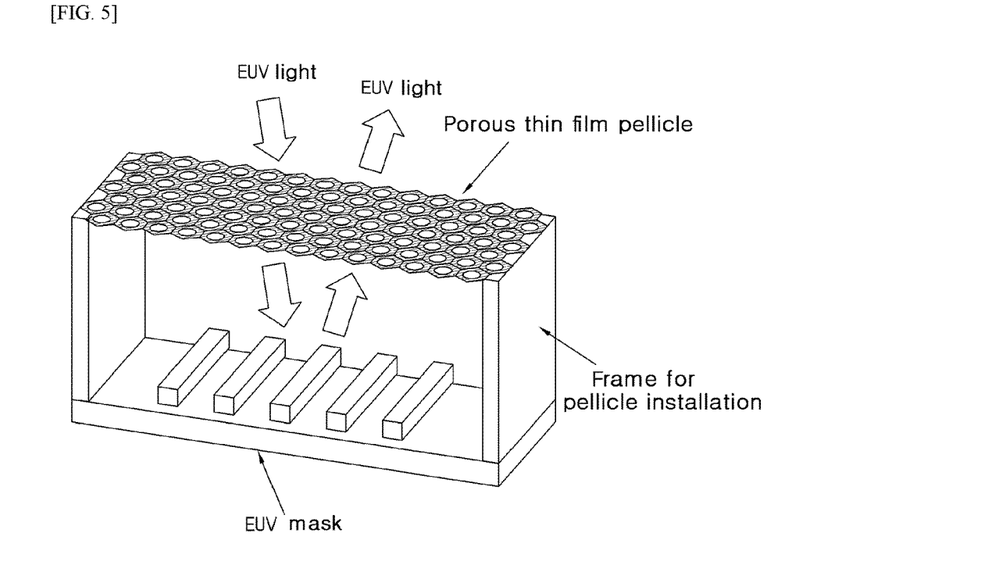
FIG. 5 shows an example use of a pellicle for EUV lithography according to another embodiment of the present invention.

FIG. 5 shows an example use of a pellicle for EUV lithography according to another embodiment of the present invention.

Referring to FIG. 5, a diagram is shown for the concept of using a porous thin film pellicle according to an embodiment of the present invention as a protective layer for an EUV mask. In this case, the porous thin film pellicle is disposed above the EUV mask using a pellicle-mounting frame.

Accordingly, by having EUV light pass through a porous thin film pellicle, reflected by an EUV mask, and again pass through a porous thin film pellicle, high transmission can be achieved for the porous thin film pellicle, and loss of light may be minimized.

Also, because of having improved strength due to increased thickness for the porous thin film pellicle and not needing a separate support structure for reinforcing strength, there is no conventional drawback of non-uniform EUV intensity due to an added support structure, after transmission through a pellicle.

FIG. 6 to FIG. 10 shows perspective views, according to processing steps, of a method of fabricating a pellicle for EUV lithography according to an embodiment of the present invention.

Figure 6:
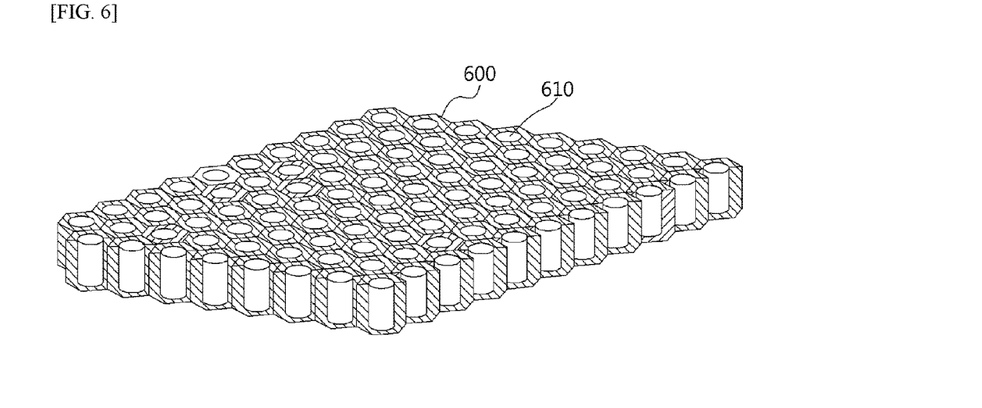
FIG. 6 to FIG. 10 are perspective views, according to processing steps, of a method of fabricating a pellicle for EUV lithography according to an embodiment of the present invention.

Referring to FIG. 6, a porous structure 600 with nano-sized holes 610 is prepared.

For example, the porous structure 600 may include anodic aluminum oxide (AAO).

Figure 7:
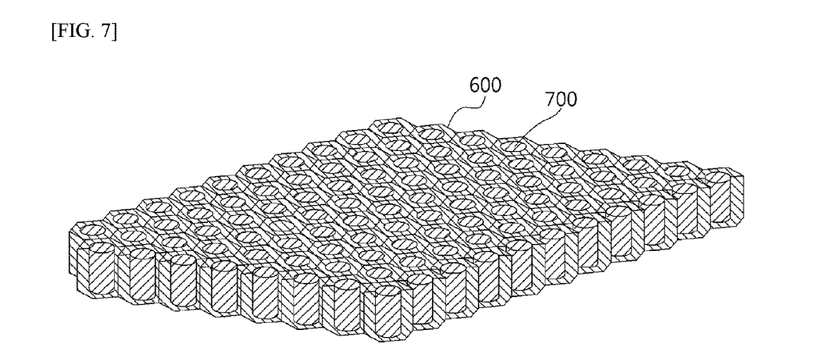

Referring to FIG. 7, a template material is injected into holes 610 of the porous structure 600. Accordingly, the injected template material is cured, and a template 700 having a shape that is complementary to the porous structure 600 may be formed. That is, a template 700 including a plurality of protrusions 710 (refer to FIG. 8) may be formed.

Here, the template material may be poly dimethylsiloxane (PDMS) or poly methyl methacrylate (PMMA).

Also, as a method of injecting a template material, various injection methods such as liquid injection may be used. For example, a template 700 may be formed by injecting a PMMA solution into an AAO porous structure 600, having the solution to be adsorbed, and then curing.

Meanwhile, the template material may not only fill holes 610 of the porous structure 600 but also cover the top of the porous structure 600 and then be cured.

Meanwhile, injecting of a template material in the holes 610 of the porous structure 600 may further include maintaining a vacuum for a specific duration after the injecting of the template material.

Accordingly, by maintaining a vacuum for a specific duration after injecting the template material, due to capillary effect, the template material may more effectively fill the holes of the porous structure. That is, by maintaining a vacuum, filling rate of holes of the porous structure with a template material may be increased.

Accordingly, by increasing filling rate in this manner, a porous structure may advantageously be made more precisely.

Figure 8:
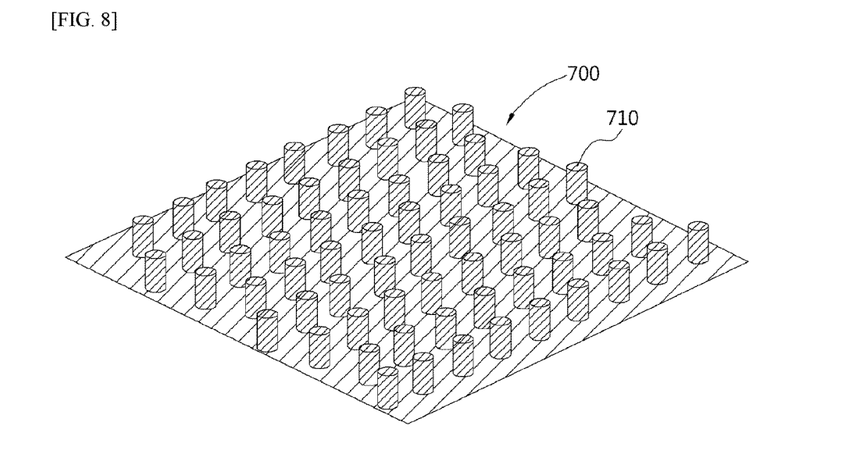

Referring to FIG. 8, the porous structure 600 is removed.

Accordingly, as the porous structure 600 is a structure with a plurality of holes 610, when the porous structure is removed, only a template 700 with a plurality of protrusions 710 complementary to the porous structure 600 remains.

Here, the porous structure 600 may be removed using various methods of selectively removing the porous structure 600, such as a wet etching process, a method of using a releasing agent on the applied mold, or separation method of using a Teflon coating. For example, an AAO porous structure may be removed through a wet etching process.

Figure 9:
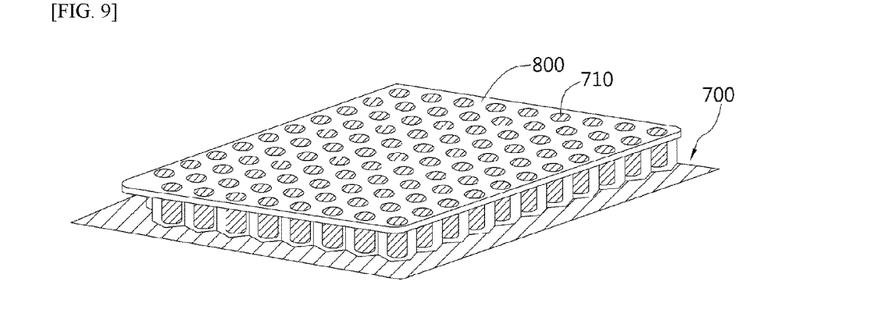

Referring to FIG. 9, a porous pellicle film 800 including the shape of the porous structure 600 may be formed by coating a template 700 with a pellicle material.

For example, a porous pellicle film 800 including a plurality of holes 810 (refer to FIG. 10) may be formed by coating, with pellicle material, a template 700 on which a plurality of protrusions 710 are disposed.

Here, a material for the pellicle may include Zr, Mo, Y, Si, Rb, Sr, Nb, or Ru.

For example, a material for the pellicle may be coated on a template 700 using various thin film deposition methods such as atomic layer deposition (ALD), sputtering, chemical vapor deposition CVD, ion beam deposition (IBD), or electro plating, etc.

For example, using a duplication method twice on an AAO porous structure including a plurality of holes, a porous thin film pellicle 800 including a plurality of holes 810, which is identical in structure with the AAO structure, may be formed.

Meanwhile, final form of the porous thin film pellicle 800 may be adjusted by adjusting, in advance, diameter of holes 610 or thickness of the thin film of the porous structure 600. For example, hole diameter or thickness of an AAO porous structure may be adjusted through an AAO growth technique.

Figure 10:
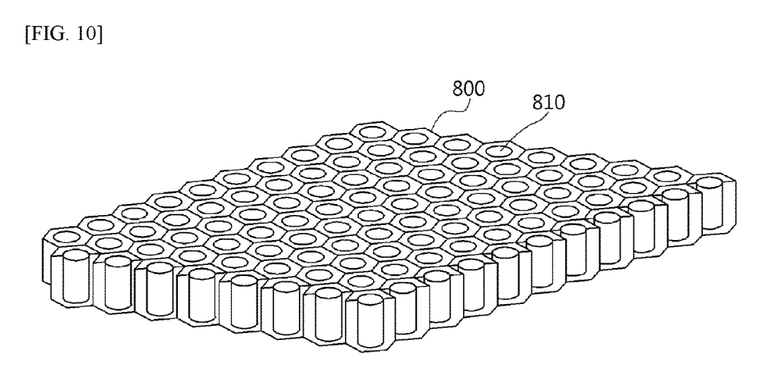

Referring to FIG. 10, the template 700 is removed.

Here, various removal methods of selectively removing a template such as a wet etching process may be used. For example, a PMMA template may be removed using a wet etching process.

Accordingly, only a porous thin film pellicle 800 including a plurality of holes 810 finally remains.

Measurement of Transmittance Through a Silicon Thin Film and Porous Thin Film

Figure 11:
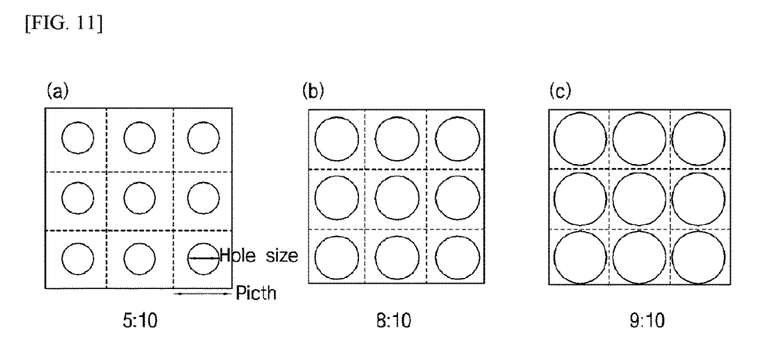
FIG. 11 shows mimetic diagrams according to ratio of diameter and pitch of holes of a pellicle for EUV lithography according to an embodiment of the present invention.

FIG. 11 shows mimetic diagrams according to ratio of diameter and pitch of holes of a pellicle for EUV lithography according to an embodiment of the present invention.

FIG. 11(a) shows a case in which a ratio of pellicle hole diameter and pitch is 5:10, FIG. 11(b) shows a case in which a ratio of pellicle hole diameter and pitch is 8:10, and FIG. 11(c) shows a case in which a ratio of pellicle hole diameter and pitch is 9:10.

Thickness-dependent transmittance was measured for Si single thin film and Si porous thin films with the ratios of pellicle hole diameter and pitch shown in FIG. 11.

Figure 12:
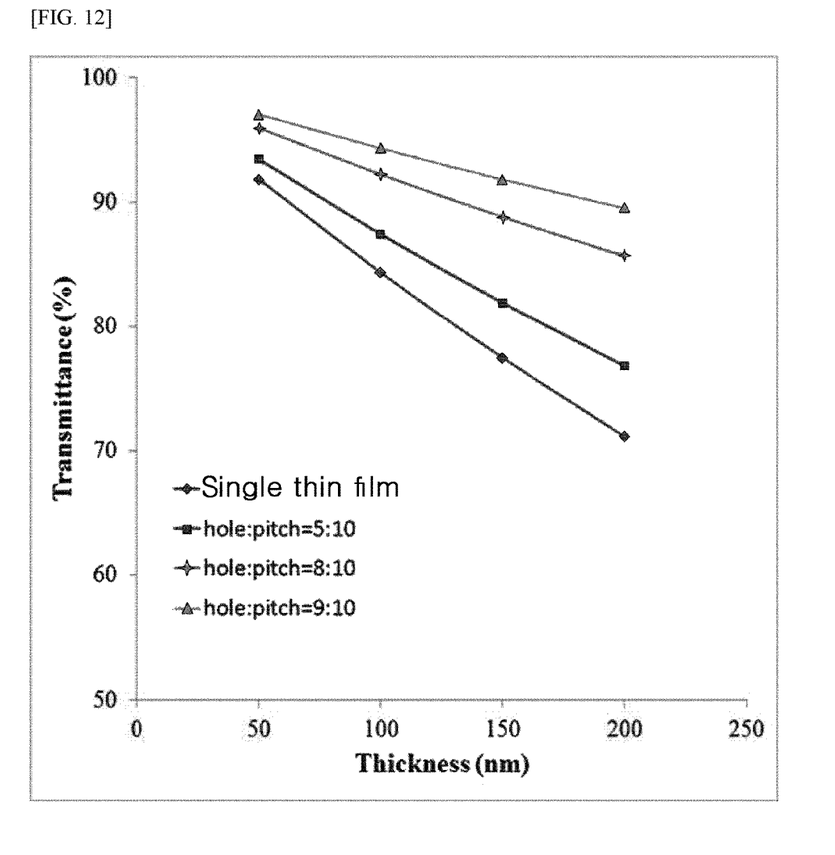
FIG. 12 is a graph of measured light transmission according to thicknesses of a single Si thin film and a porous Si thin film.

FIG. 12 is a graph of measured light transmittance according to thicknesses of a single Si thin film and a porous Si thin film.

Also, thickness-dependent transmittance was measured for Zr single thin film and Zr porous thin films with the ratios of pellicle hole diameter and pitch shown in FIG. 11.

Figure 13:
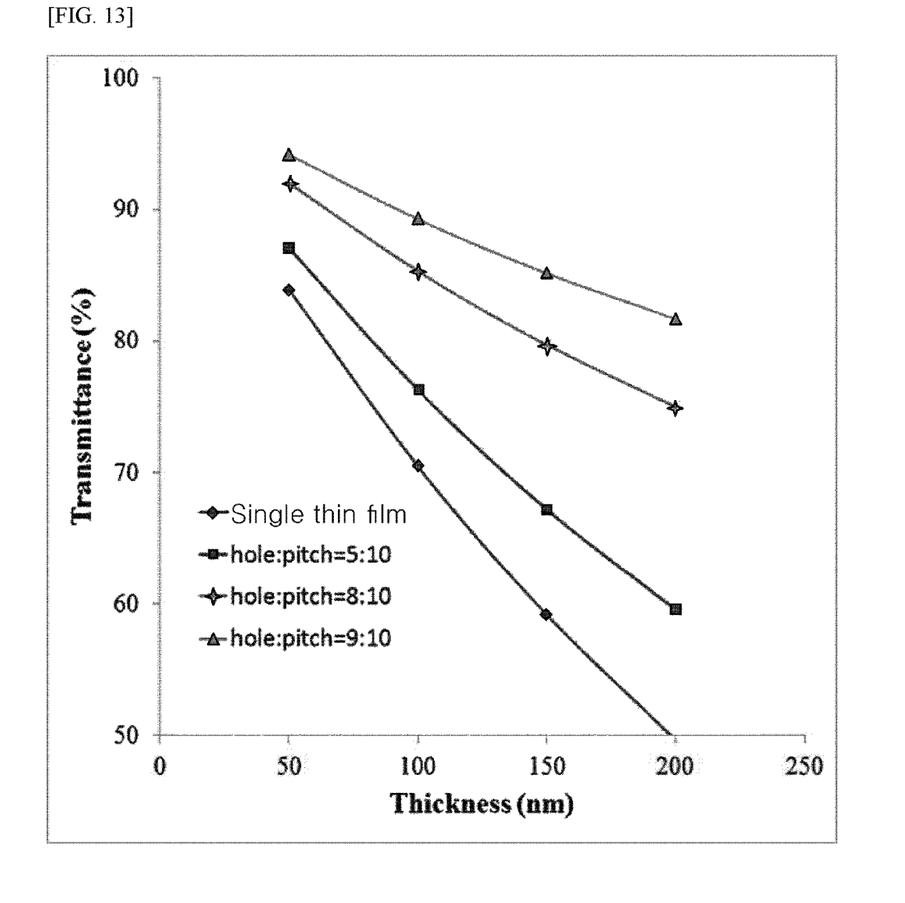
FIG. 13 is a graph of measured light transmission according to thicknesses of a single Zr thin film and a porous Zr thin film.

FIG. 13 is a graph of measured light transmission according to thicknesses of a single Zr thin film and a porous Zr thin film.

EUV transmission results in FIGS. 12 and 13 are shown in Tables 3 to 6 below.

Table 3 below shows thickness-dependent EUV transmission for a single thin film without holes.

TABLE 3

| Thin film Thickness | 50 nm | 100 nm | 150 nm | 200 nm |
|---|---|---|---|---|
| Si | 91.9 | 84.4 | 77.5 | 71.2 |
| Zr | 84.0 | 70.5 | 59.2 | 49.7 |

Table 4 below shows thickness-dependent EUV transmission for a case of a ratio of hole diameter and pitch at 5:10.

TABLE 4

| Thin film Thickness | 50 nm | 100 nm | 150 nm | 200 nm |
|---|---|---|---|---|
| Si | 93.5 | 87.4 | 81.9 | 76.8 |
| Zr | 87.1 | 76.3 | 67.2 | 59.6 |

Table 5 below shows thickness-dependent EUV transmission for a case of a ratio of hole diameter and pitch at 8:10.

TABLE 5

| Thin film Thickness | 50 nm | 100 nm | 150 nm | 200 nm |
|---|---|---|---|---|
| Si | 95.9 | 92.2 | 88.8 | 85.7 |
| Zr | 92.0 | 85.3 | 79.7 | 75.0 |

Table 6 below shows thickness-dependent EUV transmission for a case of a ratio of hole diameter and pitch at 9:10.

TABLE 6

| Thin film Thickness | 50 nm | 100 nm | 150 nm | 200 nm |
|---|---|---|---|---|
| Si | 97 | 94.3 | 91.8 | 89.5 |
| Zr | 94.2 | 89.3 | 85.1 | 81.7 |

Referring to FIG. 12 and FIG. 13 and Table 3 to Table 6, in the case of a ratio of hole diameter and pitch at 9:10, a porous thin film of 200 nm thickness has a transmission value similar to that of a single thin film with a thickness of 50 nm.

Accordingly, when fabricating a pellicle using a porous thin film, thickness may be increased for the same transmission, and thus strength may be increased.

Meanwhile, embodiments of the present invention shown in the present disclosure and drawings are for enhancing understanding and are not intended to limit the scope of the present invention. To a person with ordinary knowledge in the art to which the present invention belongs, it is clear that, besides the disclosed embodiments, other modified embodiments based on the technical concepts of the present invention are possible.

DESCRIPTION OF REFERENCE NUMERALS

| | |
|---|---|
| 100: first inorganic layer | 200: first coupling layer |
| 300 strength reinforcing layer | 400: second coupling layer |
| 500: second inorganic layer | 600: porous structure |
| 610: hole | 700: template |
| 710: protrusion | 800: porous thin film pellicle |
| 810: hole | |

The invention claimed is:

1. A pellicle for EUV lithography, comprising:
a first inorganic layer including an inorganic material with an extinction coefficient less than or equal to 0.02;
a first coupling layer disposed on the first inorganic layer and including an organic material having a functional group belonging to the catechol group; and
a strength reinforcing layer disposed on the first coupling layer and including a carbon nanostructure,
wherein the first coupling layer increases coupling strength between the first inorganic layer and the strength reinforcing layer.

2. The pellicle for EUV lithography of claim 1, wherein the first inorganic layer includes Zr, Mo, Y, Si, Rb, Sr, Nb, or Ru.

3. The pellicle for EUV lithography of claim 1, wherein the first coupling layer includes dopamine, polydopamine, norepinephrine, polynorepinephrine, epinephrine, or polyepinephrine.

4. The pellicle for EUV lithography of claim 1, wherein a thickness of the first coupling layer is less than or equal to 10 nm.

5. The pellicle for EUV lithography of claim 1, wherein the carbon nanostructure includes graphene or carbon nanotubes.

6. The pellicle for EUV lithography of claim 5, wherein the strength reinforcing layer is a carbon nanotube mesh.

7. The pellicle for EUV lithography of claim 1, further comprising:
a second coupling layer disposed on the strength reinforcing layer and including an organic material having a functional group belonging to the catechol group; and
a second inorganic layer disposed on the second coupling layer and including an inorganic material with an extinction coefficient less than or equal to 0.02.

8. The pellicle for EUV lithography of claim 7, wherein the second coupling layer increases coupling strength between the strength reinforcing layer and the second inorganic layer.

9. The pellicle for EUV lithography of claim 7, wherein the second coupling layer includes dopamine, polydopamine, norepinephrine, polynorepinephrine, epinephrine, or polyepinephrine.

10. The pellicle for EUV lithography of claim 7, wherein the second inorganic layer includes Zr, Mo, Y, Si, Rb, Sr, Nb, or Ru.

11. A pellicle for EUV lithography which is a porous thin film pellicle including a plurality of holes and a material with an extinction coefficient less than or equal to 0.02, wherein a diameter of the holes is less than or equal to 1 μm.

12. The pellicle for EUV lithography of claim 11, wherein the porous thin film pellicle includes Zr, Mo, Y, Si, Rb, Sr, Nb, or Ru.

13. The pellicle for EUV lithography of claim 11, further comprising a cap layer disposed on the porous thin film pellicle and is made of a material with an extinction coefficient less than or equal to 0.02.

14. A method of fabricating a pellicle for EUV lithography, the method comprising:
preparing a porous structure with nano-sized holes;
forming a template with a shape that is complementary to the shape of the porous structure, by injecting a template material into the holes of the porous structure;
removing the porous structure;
forming a porous thin film pellicle including the shape of the porous structure by coating the template with a pellicle material; and
removing the template.

15. The method of claim 14, wherein the porous structure includes anodized aluminum.

16. The method of claim 14, wherein the template material is PDMS or PMMA.

17. The method of claim 14, wherein the injecting the template material into the holes of the porous structure includes increasing filling rate of the holes of the porous structure being filled with the template material by maintaining a vacuum for a specific duration after the injecting the template material.

18. The method of claim 14, wherein the pellicle material includes Zr, Mo, Y, Si, Rb, Sr, Nb, or Ru.

* * * * *